United States Patent

Querry

[15] 3,652,944

[45] Mar. 28, 1972

[54] PULSE-CHARACTERISTIC MODIFYING CIRCUIT

[72] Inventor: Lester Richard Querry, Laurel, Md.

[73] Assignee: The Bunker-Ramo Corporation, Canoga Park, Calif.

[22] Filed: May 19, 1969

[21] Appl. No.: 825,650

[52] U.S. Cl. ................................328/168, 328/116, 330/29, 330/141

[51] Int. Cl. ..........................................................H03b 3/02

[58] Field of Search ..................328/116, 117, 168; 307/235; 330/29, 136, 141, 14

[56] References Cited

UNITED STATES PATENTS

| | | | |
|---|---|---|---|
| 3,076,145 | 1/1963 | Copeland | 328/117 |
| 3,289,157 | 11/1966 | Brokaw | 328/117 |
| 3,191,124 | 6/1965 | Brown | 330/29 |
| 3,523,254 | 8/1970 | Royer | 330/29 |
| 3,526,849 | 9/1970 | Dishal | 330/141 |

*Primary Examiner*—Donald D. Forrer
*Assistant Examiner*—David M. Carter
*Attorney*—Frederick M. Arbuckle

[57] ABSTRACT

A circuit for utilizing a first characteristic pf a single pulse to control the modifying of a second characteristic of the pulse without causing any pulse distortion. The pulse is delayed while a pseudo-pulse is generated having the same first characteristic as the pulse and the pseudo-pulse is utilized to set a second-characteristic modifying means. When the modifying means has been set the delayed pulse is applied through the modifying means.

6 Claims, 1 Drawing Figure

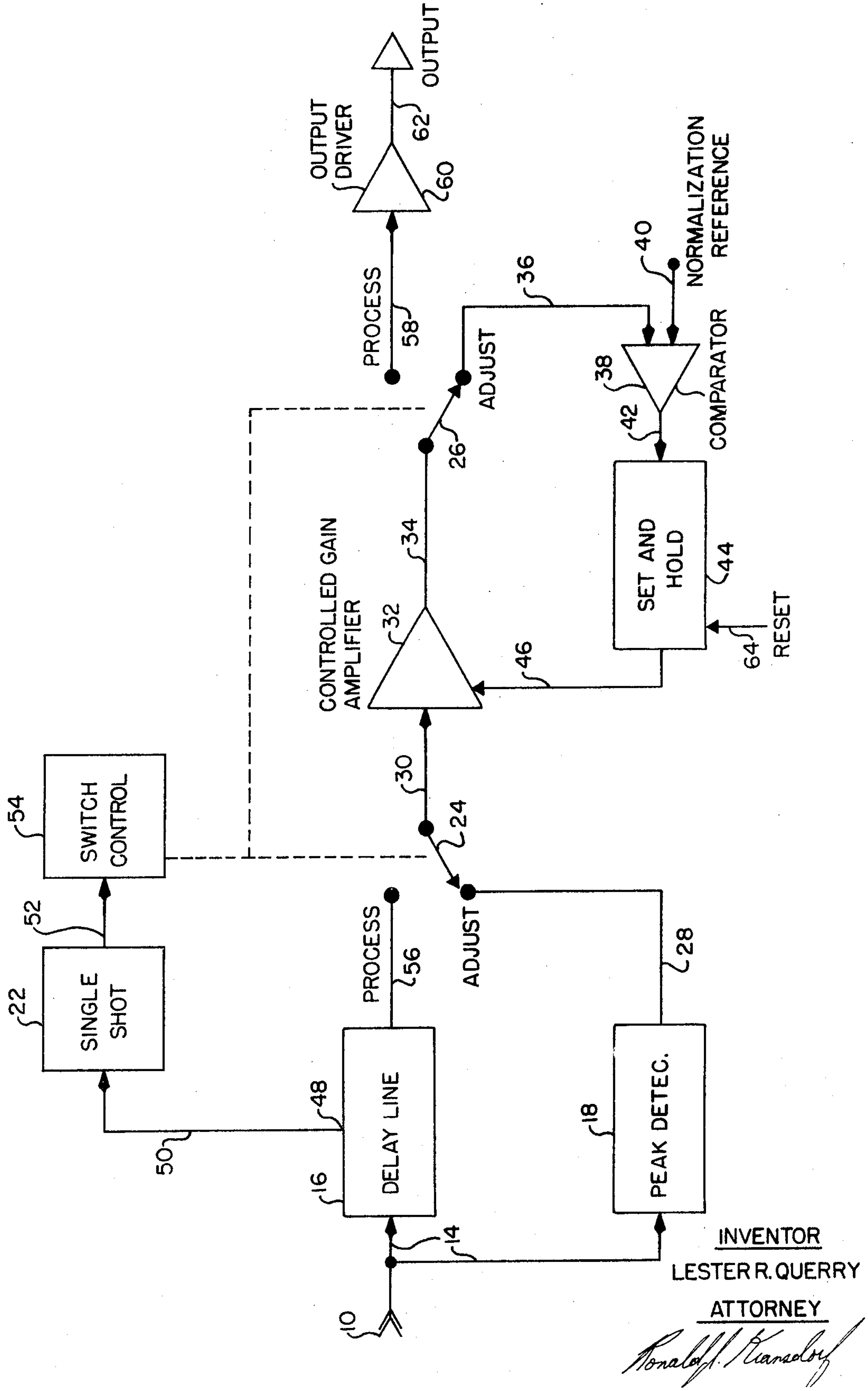
INVENTOR
LESTER R. QUERRY
ATTORNEY
Ronald J. Kransdorf

PULSE-CHARACTERISTIC MODIFYING CIRCUIT

The invention herein described was made in the course of or under a contract with the Department of the Air Force.

This invention relates to pulse-characteristic modifying circuits of the type where a first characteristic of a received pulse is utilized to control the modifying of a second characteristic of the pulse and more particularly to a pulse-characteristic modifying circuit of the type indicated which is capable of operating with only a single input pulse.

Circuits which modify the amplitude, or some other characteristic of an applied pulse are utilized in a variety of electronic applications. Examples of such circuits include pulse amplification or pulse attenuation circuits, automatic gain control (AGC) circuits, and pulse amplitude normalizers. Existing circuits for performing pulse-characteristic modification are of two general types. In the first type, the modification which is performed is the same regardless of the nature of the input pulse. An example of this type of circuit is a pulse amplifier, the output from which is always greater than (for example, twice) the amplitude of the input, or a pulse attenuator, the output from which is always less than (for example, half) the amplitude of the input. A circuit of this type may, for example, utilize an amplifier with a fixed gain. Therefore, a circuit of this type may operate on a single input-pulse, a monopulse, basis without causing any distortion in the circuit output.

In the second type of circuit, the modification which is performed is a function of some characteristic of the input pulse. A pulse amplitude normalizer or an AGC circuit are examples of this type of circuit. Since, in a pulse amplitude normalizer for example, the amplifier gain is dependent on the peak amplitude of the received pulse, the pulse which is utilized to set the gain of the amplifier will be distorted as the amplifier gain changes. In applications where circuits of this type are utilized, a train of pulses is applied to the circuit. The first few pulses of the train are utilized to set the amplifier gain, and suffer the distortion which occurs with the gain adjustment.

However, there are some applications, such as in pulse analysis, where it may be desired to, for example, normalize each received pulse. This permits a substantial simplification in the analyzing circuitry. Since, in an application of this type, characteristics of the pulse, such as its rise and fall time, may be of interest, distortion of the received pulse cannot be tolerated. It is thus apparent that there are applications where neither existing type of pulse-characteristic modifying circuit can perform satisfactorily.

It is, therefore, a primary object of this invention to provide an improved pulse-characteristic modifying circuit.

A more specific object of this invention is to provide a pulse-characteristic modifying circuit which is capable of providing distortionless operation in a monopulse environment in applications where the modification performed varies as a function of some characteristic of the input pulse.

A still more specific object of the invention is to provide a pulse amplitude normalizer adapted for distortion-free monopulse operation.

In accordance with these objects, this invention provides a pulse-characteristic modifying circuit which includes a means for detecting a first characteristic of the pulse, such as its peak amplitude, and a means adapted to modify a second characteristic of the pulse, such as its amplitude. A means is provided for utilizing the detected first characteristic to set the modifying means with the received pulse being stored for a time sufficient to permit the setting of the modifying means. After the modifying means has been set, a means becomes operative for applying the pulse from the storing means to the modifying means. In a preferred embodiment, the modifying means is a controlled-gain amplifier and the storing means is a delay line. The output from a peak detector is applied through a switch to the amplifier with the output from the amplifier being applied through a feedback loop to control the gain of the amplifier. When the gain of the amplifier has been set, the switch is transferred, permitting the output from the delay line to be applied through the now set amplifier to the circuit output.

The foregoing and other objects, features and advantages of the invention will be apparent from the following more particular description of a preferred embodiment of the invention as illustrated in the accompanying drawing.

The single FIGURE is a schematic block diagram of a preferred embodiment of the invention.

Referring now to the figure, it is seen that an input pulse on line 10 is applied through line 14 to delay line 16 and peak detector 18. Detector 18 may be any one of a variety of existing circuits which are capable of rapidly detecting the peak amplitude of a received pulse. The circuit also includes a single-shot 22 which is normally in a reset condition. As will be seen shortly, when single-shot 22 is in its reset condition, switch 24 and switch 26 are in their adjust position as shown in the figure. While for purposes of illustration, these switches have been shown as mechanical devices in the figure, solid-state electronic switches would be required in any practical circuit in order to achieve the required switching speed. With the switches set as indicated, the output from peak detector 18 is applied through line 28, switch 24, and line 30 to the input of controlled-gain amplifier 32. The output from amplifier 32 is applied through line 34, switch 26, and line 36, to one input of comparator 38. The other input to comparator 38 is a reference potential on line 40 which is equal to the peak output voltage which is desired from amplifier 32. Comparator 38 generates a positive output on line 42 when the input on line 36 is greater than the input on line 40 and a negative output on line 42 at all other times. Set-and-hold circuit 44 may be considered to be an integrator. Thus, an element such as a capacitor in circuit 44 charges when there is a positive potential on line 42 and holds this charge when the input on line 42 goes negative. The charge stored in circuit 44 is applied through line 46 to control the gain of amplifier 32. Thus the charge stored in circuit 44 will continue to increase until the gain of amplifier 32 has been adjusted such that the output resulting from the peak value stored in detector 18 is equal to the level on line 40. At this time the signal on line 42 will go negative, preventing further change in the amplifier gain.

The position of tap 48 on delay line 16 is selected so that the delay between the delay line input and tap 48 is greater than the duration of the longest pulse which the circuit is adapted to receive. Thus, the gain of amplifier 32 will be properly set before the leading edge of the pulse reaches this tap. The signal on output line 50 from tap 48 is applied to set single-shot 22. Single-shot 22 being set results in a signal on line 52 which is applied to switch-control circuit 54. Switch-control circuit 54 generates control signals for the switches 24 and 26, to transfer them from the position shown in the figure to their Process position. Thus, when the leading edge of the pulse appears on output line 56 from delay line 16, switch 24 is transferred so that the pulse is applied through line 30 to amplifier 32. Since the gain of the amplifier has been previously set, the pulse undergoes no distortion in passing through the amplifier. Since switch 26 has also been transferred, the output from amplifier 32 is applied through line 34, switch 26, line 58, and output driver 60 to circuit output line 62.

The duration of single-shot 22 is sufficient to permit the longest pulse which the circuit is adapted to receive to pass to output line 62. When single-shot 22 times out, the signal on line 52 terminates thus permitting switches 24 and 26 to return to their normal, or Adjust, position shown in the figure. The timing-out of single-shot 22 also results in a pulse on line 64 which resets set-and-hold circuit 44. The circuit is thus reset in preparation for a new input pulse.

The principle limitation of the above-described circuit is that the pulse repetition rate be sufficiently slow so as to permit the adjustment of amplifier 32 before each pulse is processed. Stated in another way, the interval between input pulses must be greater than the delay time of line 16 plus the system recovery time. In most applications of the system, this limitation presents no problem.

Thus, a circuit has been described in which a pseudo-pulse is generated which has the same first characteristic, (peak amplitude for the preferred embodiment) as the input pulse. This pseudo-pulse is utilized to set the modifying element, the gain of the amplifier for the preferred embodiment, with the application of the input pulse to the modifying element being delayed until the element has been set. While the preferred embodiment of the invention is the pulse normalizer described above, the teachings of this invention may be utilized in any application where it is desired to utilize a first characteristic of an applied pulse to control the modification of a second characteristic of the pulse. In some applications the first and second characteristic may be the same. Thus, for example, in place of peak detector 18, a circuit might be provided which detects the average amplitude of the input, or the pulse width, or pulse rise time, or any of a variety of other characteristics. Similarly, reference 40 may be a desired average amplitude, or some other desired amplitude. Further, while the circuit is primarily adapted for amplitude control, in some applications it might be possible to substitute a pulse width control circuit or the like for pulse amplitude control circuit 32. Finally, while a delay line 16 is the ideal storage device in most applications of this invention, there might be some applications in which a register or some other storage device might be utilized.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A monopulse-character modifying circuit comprising:
means responsive to a first predetermined characteristic of a received pulse for modifying a second predetermined characteristic of the pulse;
means for delaying a received input pulse;
means responsive to a received input pulse for generating a pseudo-pulse having the same first characteristic as said received pulse;
means for applying said pseudo-pulse through said modifying means;
feedback means responsive to the output from said modifying means caused by said pseudo-pulse for setting said modifying means; and
means operative after said modifying means has been set by said pseudo-pulse for applying the received pulse in said delay means through said modifying means.

2. A circuit of the type described in claim 1 wherein said second predetermined characteristic is amplitude.

3. A circuit of the type described in claim 1 wherein said first predetermined characteristic is an amplitude.

4 A circuit of the type described in claim 3 wherein said first predetermined characteristic is the peak amplitude of said received pulse, wherein said second predetermined characteristic is the amplitude of each point of the pulse, and wherein said circuit is a pulse amplitude normalizer.

5. A pulse amplitude normalizer comprising:
a controlled gain amplifier;
means for detecting the peak amplitude of a received pulse;
means for passing an indication of said peak amplitude through said amplifier;
feedback means responsive to the output from said amplifier when said peak amplitude indication is applied thereto for setting the gain of said amplifier;
means for storing the pulse applied to said circuit for a period of time sufficient to permit the setting of said amplifier; and
means operative after said amplifier has been set for applying the pulse from said storing means through said amplifier.

6. A circuit of the type described in claim 5 wherein said storing means is a delay line.

* * * * *